United States Patent
Bae et al.

(10) Patent No.: US 9,479,272 B2
(45) Date of Patent: Oct. 25, 2016

(54) METHOD AND APPARATUS FOR PROCESSING A TRANSMISSION SIGNAL IN COMMUNICATION SYSTEM

(71) Applicant: Samsung Electronics Co., Ltd., Gyeonggi-do (KR)

(72) Inventors: Jung-Hwa Bae, Gyeonggi-do (KR); In-Tae Kang, Gyeonggi-do (KR); Hae-Dong Yeon, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 14/712,255

(22) Filed: May 14, 2015

(65) Prior Publication Data

US 2015/0333944 A1 Nov. 19, 2015

Related U.S. Application Data

(60) Provisional application No. 61/996,849, filed on May 14, 2014.

(30) Foreign Application Priority Data

Aug. 26, 2014 (KR) .......................... 10-2014-0111450

(51) Int. Cl.
*H04B 17/00* (2015.01)
*H04L 27/26* (2006.01)
(Continued)

(52) U.S. Cl.
CPC .......... *H04B 17/354* (2015.01); *H04B 1/0475* (2013.01); *H04L 5/0007* (2013.01); *H04L 25/03* (2013.01); *H04L 25/03006* (2013.01); *H04L 25/03821* (2013.01); *H04L 27/26* (2013.01);
(Continued)

(58) Field of Classification Search
CPC ................ H04B 15/00; H04B 1/0475; H04B 25/03821; H04B 17/354; H04B 2001/1045; H04L 27/2623; H04L 25/03; H04L 25/03006; H04L 25/03821; H03D 2200/0088
See application file for complete search history.

(56) References Cited

U.S. PATENT DOCUMENTS 9,106,324 B1 * 8/2015 Mahmoud .............. H04B 15/00
2004/0218689 A1 * 11/2004 Akhtman ............ H04L 27/2624
375/296

(Continued)

OTHER PUBLICATIONS

Saxena et al., "Performance improvement in an OFDM system with MBH combinational pulse shape," Digital Signal Processing, vol. 23, Jan. 2013, pp. 314-321.*

(Continued)

*Primary Examiner* — Eva Puente
*Assistant Examiner* — Michelle M Koeth
(74) *Attorney, Agent, or Firm* — The Farrell Law Firm, P.C.

(57) ABSTRACT

Disclosed are a method and apparatus for processing a transmission signal using a window function that changes a spectrum characteristic of a symbol. A transmission apparatus includes a symbol generator that generate a plurality of consecutive symbols, and a symbol windowing processor that is coupled with the symbol generator. The symbol windowing processor applies a first window function and a third window function that uses a difference between the first window and a second window, and changes a spectrum characteristic of each of the plurality of consecutive symbols, and processes neighboring symbols from among the plurality of consecutive symbols of which spectrum characteristics are changed, such that the symbols partially overlap one another.

14 Claims, 11 Drawing Sheets

(51) Int. Cl.
*H04B 17/354* (2015.01)
*H04L 5/00* (2006.01)
*H04L 25/03* (2006.01)
*H04B 1/04* (2006.01)
*H04B 1/10* (2006.01)

(52) U.S. Cl.
CPC ....... *H04L 27/2607* (2013.01); *H04L 27/2626* (2013.01); *H04L 27/2636* (2013.01); *H03D 2200/0088* (2013.01); *H04B 2001/1045* (2013.01)

(56) References Cited

U.S. PATENT DOCUMENTS

| | | |
|---|---|---|
| 2004/0252781 A1 | 12/2004 | Park |
| 2006/0008017 A1 | 1/2006 | Balakrishnan et al. |
| 2007/0009056 A1* | 1/2007 | Yeon .................. H04L 27/2634 375/260 |
| 2007/0140105 A1* | 6/2007 | Coon ..................... H04J 13/18 370/208 |
| 2008/0027716 A1 | 1/2008 | Rajendran et al. |
| 2008/0117872 A1 | 5/2008 | Kim et al. |
| 2009/0010150 A1* | 1/2009 | Kim ....................... H04L 5/023 370/210 |
| 2009/0232234 A1 | 9/2009 | Du |
| 2010/0316040 A1 | 12/2010 | Kim et al. |
| 2011/0258244 A1 | 10/2011 | Kang |
| 2012/0171975 A1 | 7/2012 | Park et al. |
| 2013/0129017 A1 | 5/2013 | Sahin et al. |
| 2013/0195052 A1* | 8/2013 | Ahmadi ............ H04W 72/0453 370/329 |
| 2013/0241750 A1 | 9/2013 | Helmrich et al. |
| 2014/0192848 A1* | 7/2014 | Rao ........................... H04L 5/00 375/219 |
| 2015/0271824 A1* | 9/2015 | Zhang ............... H04W 72/0453 370/329 |

OTHER PUBLICATIONS

Smith, "Bartlett ("Triangular") Window," Spectral Audio Signal Processing, http://ccrma.stanford.edu/~jos/sasp/Bartlett_Triangular_Window.html, online book, 2011 edition, accessed Nov. 13, 2015.*
"Cognitive radio: making software radios more personal," in Personal Communications, IEEE, vol. 6, No. 4, pp. 13-18, Aug. 1999.*
Saxena et al., "Performance improvement in an OFDM system with MBH combinational pulse shape," Digital Signal Processing, vol. 23, Jan. 2013, pp. 314-321.*
Smith, "Bartlett ("Triangular") Window," Spectral Audio Signal Processing,http://ccrma.stanford.edu/~jos/sasp/Bartlett_Triangular_Window.html, online book, 2011 edition, accessed Nov. 13, 2015.*
Wenbo et al., "Power System Harmonic Detection Based on Bartlett-Hann Windowed FFT Interpolation," in Power and Energy Engineering Conference (APPEEC), 2012 Asia-Pacific, pp. 1-3, Mar. 27-29, 2012.*
Beaulieu, Norman C. et al., A "Better Than" Nyquist Pulse, IEEE Communications Letters, vol. 5, No. 9, Sep. 2001, 367-368.

* cited by examiner

METHOD AND APPARATUS FOR PROCESSING A TRANSMISSION SIGNAL IN COMMUNICATION SYSTEM

PRIORITY

This application claims priority under 35 U.S.C. §119(a) to U.S. Provisional Patent Application Ser. No. 61/996,849, which was filed in the United States Patent and Trademark Office on May 14, 2014 and Korean Application Serial No. 10-2014-0111450, which was filed in the Korean Intellectual Property Office on Aug. 26, 2014, the contents of each of which are incorporated herein by reference.

BACKGROUND

1. Field of the Disclosure

The present disclosure relates to a method and apparatus for processing a transmission signal using a window function that changes a spectrum characteristic of a symbol, such as a spectrum emission mask or side-lobe attenuation in a spectrum.

2. Description of the Related Art

Orthogonal Frequency Division Multiplexing (OFDM)/Orthogonal Frequency Division Multiple Access (OFDMA) is a scheme that divides a data stream having a high transmission rate into multiple data streams with a low transmission rate, and transmits the multiple data streams in parallel using a plurality of subcarriers. OFDM/OFDMA has a high data transmission rate and high frequency efficiency, and may be robust to a frequency fading channel.

In Long Term Evolution (LTE) that is standardized by the $3^{rd}$ Generation Partnership Project (3GPP), a Single Carrier-Frequency Division Multiple Access (SC-FDMA) scheme is used for uplink data transmission.

SC-FDMA is considered to be a modified version of OFDMA. In SC-FDMA, a transmitter transmits an information symbol using different orthogonal frequencies (subcarriers), as in OFDMA.

In OFDM/OFDMA/SC-FDMA/or SC-FDC (Single carrier frequency domain equalizer), Inter-Symbol Interference (ISI) may be removed by adding a guard interval, which is longer than a delay spread of a channel, between OFDM/OFDMA/SC-FDMA symbols (hereinafter, symbols) so as not to lose orthogonality of subcarriers due to a channel. A Cyclic Prefix (CP) or Cyclic Postfix is inserted into the guard interval to secure connectivity of the entire symbol section including the guard interval. That is, when a part of a symbol is copied and is inserted into a guard interval as a CP, and is disposed at the beginning of the symbol, the symbol is cyclically extended, thereby eliminating Inter-Symbol Interference (ISI) caused by multipath wireless channels.

OFDM/OFDMA/SC-FDMA may also implement parallel transmission of subcarriers using Inverse Fast Fourier Transform (IFFT) on a transmission side and Fast Fourier Transform (FFT) on a reception side. Accordingly, each of the subcarriers of an OFDM/OFDMA/SC-FDMA signal is formed in a sinc (=sin(x)/x) function, maintains orthogonality, and overlaps one another. Due to the characteristics of the sinc function, the OFDM/OFDMA/SC-FDMA signal is not band-limited and causes interference in an adjacent band.

To reduce adjacent channel interference, guard bands are reserved in band edges, in which no signal is transmitted through a few carriers in both ends of a corresponding band, instead of transmitting data through all subcarriers in an IFFT frequency band. However, a side-lobe of the sinc function itself is relatively large. To reduce adjacent channel interference only by increasing the length of guard band, the number of subcarriers through which data is not transmitted needs to be increased, which significantly decreases spectral efficiency.

Accordingly, time windowing is widely used as a method of reducing adjacent channel interference while maintaining spectral efficiency. The use of time windowing efficiently attenuates sidelobes in a spectrum caused by the sinc shape spectral leakage by applying gradually ascending or descending windowing to a Cyclic Prefix (CP) or both ends of data of a symbol, such that a rectangular shape of the symbol is smoothly increased or decreased. The side-lobe attenuation is essentially used for satisfying a spectrum emission mask or an Adjacent Channel Leakage Ratio (ACLR) specified in communication standards, which regulates the amount of interference to adjacent channels. A raised cosine window is mostly used among various windows used for the windowing scheme. For example, adjacent channel interference may be reduced by suppressing the amount of the spectral leakage outside a designated band using a window such as the raised cosine window.

A technique for attenuating the side-lobe spectrum of a signal may also use a lowpass/bandpass filtering scheme.

In the case of a coefficient value of the raised cosine window, however, a side-lobe attenuation rate in an output spectrum is determined, and an attenuation level is adjusted based on a roll-off factor associated with a change in a window length. As such, the raised cosine window occasionally fails to satisfy a spectrum emission mask. In this instance, a Low Pass Filter (LPF) including a large number of taps may be additionally used.

However, the spectral portion closest to the main-lobe of the spectrum requires digital processing since this portion is difficult to attenuate using an analog filter. Also, although standards requirements can be satisfied in a digital processing output, a side-lobe of an output signal may increase again due to a non-linear property of an RFIC or a Power Amplifier (PA), called spectrum regrowth. Therefore, it is desirable to provide enough margin in the spectrum emission mask or an ACLR by taking into account of the nonlinearity of the RFIC or PA together.

SUMMARY

The present disclosure has been made to address the above mentioned problems and disadvantages, and to provide at least the advantages described below.

Accordingly, an aspect of the present disclosure is to provide a class of window functions to provide extra margin in the specific frequency region in the spectrum emission mask or the ACLR, which is larger than a margin value obtained using the normal bell-shaped class of windows.

Another aspect of the present disclosure is to provide a transmission apparatus and method using a Side-lobe Position Adjustable Window (SPAW).

A further aspect of the present disclosure is to provide a method and apparatus for reducing adjacent channel interference using a window function, instead of using a lowpass/bandpass filtering scheme.

In accordance with an aspect of the present disclosure, a transmission apparatus includes a symbol generator that generates a plurality of consecutive symbols, and a symbol windowing processor that is coupled with the symbol generator, wherein the symbol windowing processor is configured to apply a first window function and a third window function that uses a difference between the first window function and a second window function, and change a spectrum characteristic of each of the plurality of consecutive symbols, and process neighboring symbols from among the plurality of consecutive symbols of which spectrum characteristics are changed, such that the neighboring symbols partially overlap one another In accordance with another aspect of the present disclosure, a transmission method includes generating a plurality of consecutive symbols, changing a spectrum characteristic of each of the plurality of consecutive symbols by applying a first window function and a third window function that uses a difference between the first window function and a second window function, and processing neighboring symbols from among the plurality of consecutive symbols of which spectrum characteristics are changed, such that the neighboring symbols partially overlap one another.

In accordance with another aspect of the present disclosure, a transmitter includes a communication modem, wherein the communication modem executes generating a plurality of consecutive symbols, changing a spectrum characteristic of each of the plurality of consecutive symbols by applying a first window function and a third window function that uses a difference between the first window function and a second window function, and processing neighboring symbols from among the plurality of consecutive symbols of which spectrum characteristics are changed, such that the neighboring symbols partially overlap one another.

BRIEF DESCRIPTION OF THE DRAWINGS

The above and other aspects, features, and advantages of the present disclosure will be more apparent from the following detailed description taken in conjunction with the accompanying drawings, in which.

DETAILED DESCRIPTION OF EMBODIMENTS OF THE DISCLOSURE

Hereinafter, embodiments of the present disclosure will be described in detail with reference to the accompanying drawings. A detailed description of known functions and configurations incorporated herein will be omitted for the sake of clarity and conciseness. The terms which will be described below are defined in consideration of the functions in the present disclosure, and may be different according to users, intentions of the users, or customs. Accordingly, the definitions of the terms should be made on the basis of the overall context of the present disclosure.

Hereinafter, various embodiments of the present disclosure will describe a method and apparatus for processing a transmission signal by applying a window function, which may be defined by a product of a window function and a time domain sample sequence, based on a sample unit.

In the descriptions provided below, applying the window function is identical to windowing.

A length of a symbol that is extended by windowing in the windowing process may be processed to overlap previous and subsequent windowing-processed symbols. As such, power before and after windowing processing remains unchanged because a raised cosine window function that satisfies the Nyquist criterion is used.

Figure 1:
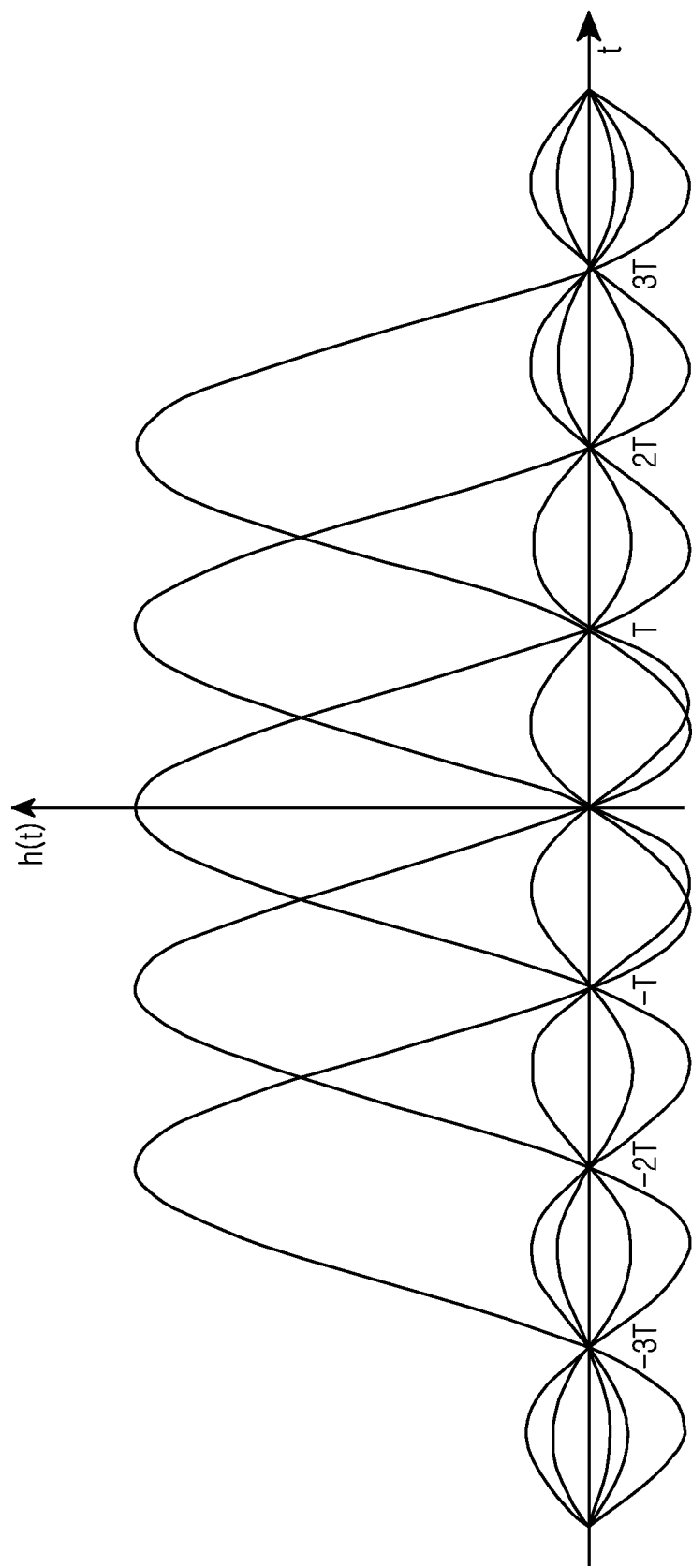
FIG. 1 illustrates an example of using a sinc function for an Inter-Carrier Interference (ICI) free channel according to various embodiments of the present disclosure.

In general, the Nyquist criterion for the zero ISI condition may be used for generating an ISI-free channel as shown in FIG. 1. When a channel impulse function is h(t), an ISI-free channel satisfies Equation (1), as follows:

$$h(nT_S) = \begin{cases} 1; n = 0 \\ 0; n \neq 0 \end{cases} \quad (1)$$

In Equation (1), n denotes an integer and $T_S$ denotes a symbol duration. The function is converted into the frequency domain based on Equation (2), as follows:

$$\frac{1}{T_S} \sum_{k=-\infty}^{+\infty} H\left(f - \frac{k}{T_S}\right) = 1, \forall f \quad (2)$$

Figure 2:
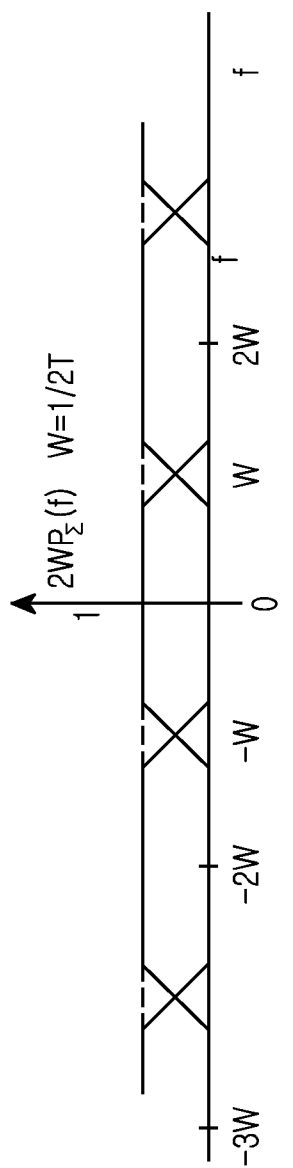
FIG. 2 illustrates the frequency response of the Nyquist zero ISI condition according to various embodiments of the present disclosure, which embodies the duality of Nyquist zero ISI condition as time domain response, that corresponds to applying time windowing to OFDM/SC-FDMA/SC-FDE symbols.

In Equation (2), H(f) is a Fourier transform function of h(t). In the Nyquist criterion, a signal sampled from the time domain may be provided in a form of Dirac delta function with respect to a sampling time. Alternatively, this indicates a condition where inter-symbol interference is zero when a sum of a folded spectrum of a signal in a frequency domain is a constant, as shown in FIG. 2.

Windowing satisfies the duality of the time/frequency domain of the Nyquist criterion. That is, windowing processes a signal in the time domain to be a constant, as opposed to processing a sum of signals in the frequency domain to be a constant. A pulse is applied to a window function of the time domain. That is, when a window function that satisfies the Nyquist criterion is applied to two symbols that overlap each other, a final result is a constant. Thus, power before and after windowing is unchanged and may be effectively used.

A difference in power between a CP section and a symbol section results in a failure to satisfy standards, which detrimentally affects power control performance such as Time Domain Automatic Gain Control (TD-AGC).

The spectrum attenuation level may be changed by adjusting a windowing length or adjusting a windowing form, as in the present disclosure. However, windowing in the windowing length adjusting scheme is directly applied to a CP and/or an end part of data of a symbol. If the windowing is applied at only a CP part, an actual length of the CP decreases. This results in distortion of part of the data, and deterioration of performance of Error Vector Magnitude (EVM) of a transmission signal. Therefore, limitations tend to arise in the scheme of extending the windowing length.

LTE standards support a variable system bandwidth. Particularly, in a bandwidth of 3 MHz, a spectrum emission mask begins from a position that is very close to a main signal, such as a position 150 kHz away from the main signal. Thus, it is difficult to satisfy standards of the spectrum emission mask.

Table 1 provided below lists values obtained by measuring a margin of the beginning of a spectrum emission mask using a raised cosine window when a 1 Resource Block Physical Uplink Shared Channel (RB PUSCH) signal is located in the far right or the far left of the spectrum emission mask in a 3 MHz bandwidth and is transmitted with a maximum power of 23 dB. That is, the margin of the beginning of the spectrum emission mask is the margin with respect to power measured in a range from 1.5M−30/2 kHz to 1.5M+30/2 kHz.

As a result of the conventional scheme, a margin of 4 dB is obtained even though a window size of 32 samples is used. In this instance, a length of a CP corresponds to 40 samples (only a first symbol in an LTE slot when IFFT 512 is used) or 36 samples (the remaining symbols when IFFT 512 is used), and most of the CP is occupied by a windowing area. This results in distortion of a signal of the CP. The margin may be measured based on a spectrum measured at a stage of DAC input. Spectrum distortion by analog devices is not thus considered in calculation of spectrum emission mask margin.

TABLE 1

| Windowing size in 3 MHz | 4 | 8 | 12 | 16 | 20 | 24 | 32 |
|---|---|---|---|---|---|---|---|
| Spectrum emission mask margin (dB) | −3.1911 | −3.0868 | −2.5832 | −1.7849 | −0.7191 | 1.4036 | 3.9689 |

When an original signal is distorted by multiplying a signal in the CP section by a windowing coefficient having a long length, the distortion may have an adverse effect on a frequency or time synchronization and tracking system such as Time Domain-Automatic Frequency Control (TD-AFC) or Time Domain Symbol Timing Recovery (TD-STR) that uses a CP correlation scheme. This results in deteriorated performance of the entire communication system. Therefore, it is desired to satisfy the spectrum and to minimize the distortion of a signal in the CP section. Accordingly, as set forth in the present disclosure, the scheme of adjusting a windowing function may be desirable over the scheme of adjusting a spectrum by increasing a windowing length.

To obtain a sufficient spectrum margin by decreasing a windowing size according to the conventional scheme, an LPF may be used in addition to windowing. If Finite-Impulse-Response (FIR) based LPF is used, the LPF requires a large number of taps for sharp cutoff from a point corresponding to 150 kHz of a main signal, while maintaining a significantly small passband ripple. This increases both the size of hardware and the power consumption of a terminal. If a notch filter type of Infinite Impulse Response (IIR) based LPF is used, the associated phase distortion degrades EVM, which is undesirable.

Figure 3A:
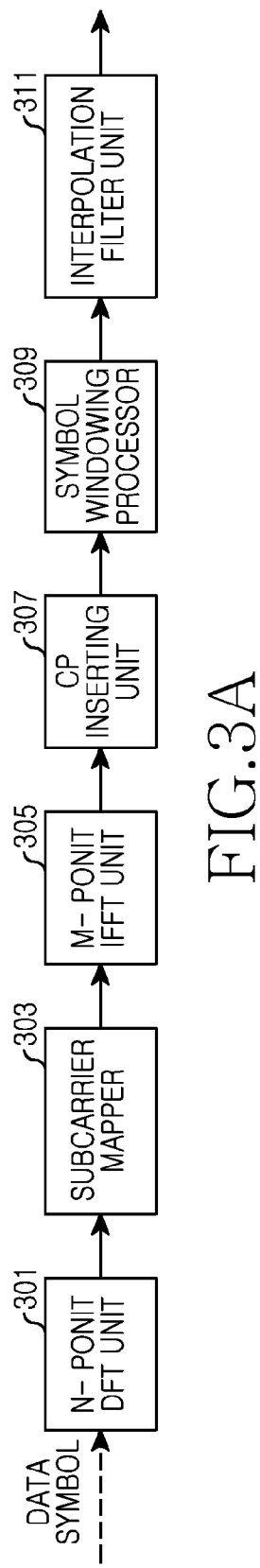
FIG. 3A is a functional block diagram of a transmitter based on SC-FDMA according to various embodiments of the present disclosure.

FIG. 3A is a functional block diagram of a transmitter based on SC-FDMA according to various embodiments of the present disclosure.

Referring to FIG. 3A, an SC-FDMA transmitter includes an N-point Discrete Fourier Transform (DFT) 301, a CP inserting unit 307, a symbol windowing processor 309, and an interpolation filter unit 311.

In an input unit of the transmitter, a baseband modulator (not illustrated) converts a binary input into a sequence of a complex number provided in one of various possible modulation formats including Binary Phase Shift Keying (BPSK), Quadrature PSK (QPSK), 16 level Quadrature Amplitude Modulation (16-QAM) and 64-QAM. The transmitter may employ a modulation format that corresponds to a current channel status, and a transmission bit rate based on the modulation format.

The transmitter groups modulation symbols into blocks including N symbols. In SC-FDMA subcarrier modulation, N-point DFT is first executed using N-point DFT 301 and generates a symbol in the frequency domain from a symbol in the time domain. The SC-FDMA transmitter may further include a serial/parallel converter that converts serial symbols into parallel symbols before DFT is executed.

Then, the subcarrier mapper 303 maps each of N DFT outputs to one of M transmittable quadrature subcarriers (M>N). A general value of M is 1024 or 2048 subcarriers and N=M/Q is an integer that is a submultiple of M. Q denotes a bandwidth extension coefficient of a symbol sequence. When all terminals transmit N symbols per block, a system potentially processes Q simultaneous transmissions without identical channel interference. A result of mapping subcarriers is a set of complex subcarrier amplitudes (l=0, 1, 2, . . . , M−1), and an amplitude of N symbols is not zero.

An M-point Inverse Fast Fourier Transform (IFFT) 305 transforms a subcarrier amplitude into a complex time domain signal. For example, the IFFT executes IFFT and generates a symbol sequence of the time domain, which is equivalent to a sum of M subcarriers obtained through orthogonal modulation from various offset frequencies (carrier frequency). The SC-FDMA transmitter may further include a parallel/serial converter that converts a parallel signal of the time domain into a serial signal, after the M-point IFFT unit 305.

According to various embodiments of the present disclosure, an Inverse Discrete Fourier Transform (IDFT) may be executed, instead of IFFT.

The CP inserting unit 307 adds a CP, which is a symbol set, to a complex time domain symbol sequence, and provides a guard interval that prevents Inter-Block Interference (IBI) incurred by a multi-path radio wave.

The symbol windowing processor 309 applies a window function of the time domain to a time domain sample sequence of a symbol, and overlaps edges of the time domain sample sequence of the symbol and parts of adjacent symbols, and enables the transmitter to satisfy a specified spectrum emission mask. According to various embodiments of the present disclosure, the symbol windowing processor 309 applies a SPAW formed of a Hanning window function, a Triangular window function, or a linear combination of the Hanning window function and the Triangular window function, and processes an edge of a symbol.

The interpolation filter unit 311 executes twofold or fourfold interpolation with respect to a windowing-processed time domain signal.

Figure 3B:
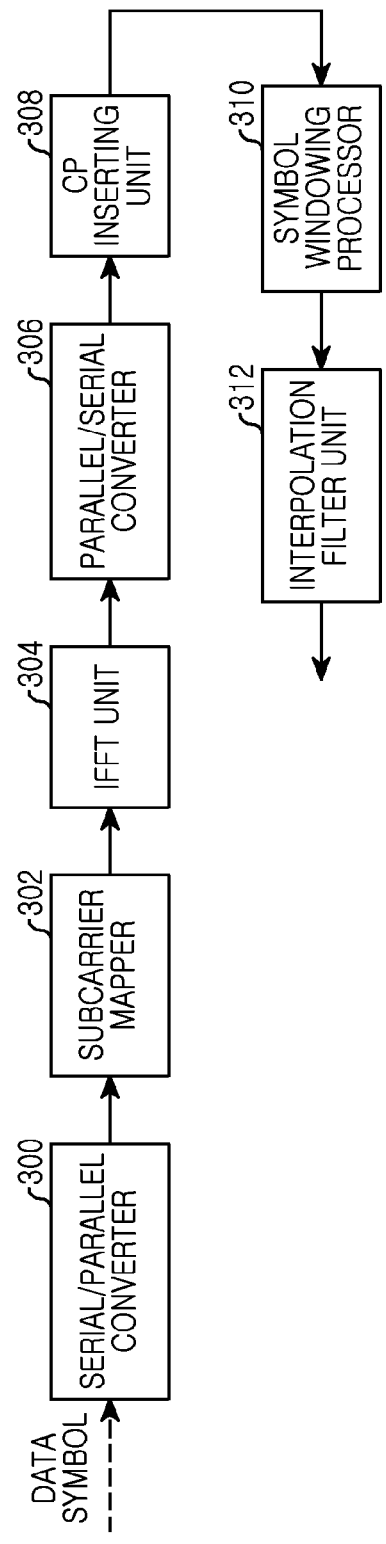
FIG. 3B is a functional block diagram of a transmitter based on OFDM according to various embodiments of the present disclosure.

FIG. 3B is a functional block diagram of a transmitter based on OFDM according to various embodiments of the present disclosure.

Referring to FIG. 3B, the transmitter based on OFDM includes a serial/parallel converter 300, a subcarrier mapper 302, an IFFT unit 304, a parallel/serial converter 306, a CP inserting unit 308, a symbol windowing processor 310, and an interpolation filter unit 312.

The serial/parallel converter 300 converts serial symbols into parallel symbols, the subcarrier mapper 302 maps each of the parallel symbols to one of orthogonal subcarriers, the IFFT 304 executes IFFT, and the parallel/serial converter 306 converts a parallel signal of the time domain into a serial signal.

The CP inserting unit 308 adds a CP, which is a symbol set, to a complex time domain symbol sequence, and provides a guard interval that prevents IBI incurred by a multi-path radio wave.

The symbol windowing processor 310 applies a window function of the time domain to a time domain sample sequence of a symbol, and overlaps edges of the time domain sample sequence of the symbol and parts of adjacent symbols, thereby enabling the transmitter to satisfy a specified spectrum emission mask. According to various embodiments of the present disclosure, the symbol windowing processor 310 applies a SPAW formed of a Hanning window function, a Triangular window function, or a linear combination of the Hanning window function and the Triangular window function, and processes an edge of a symbol.

The interpolation filter unit 312 executes twofold or fourfold interpolation with respect to a windowing-processed time domain signal.

Figure 4A:
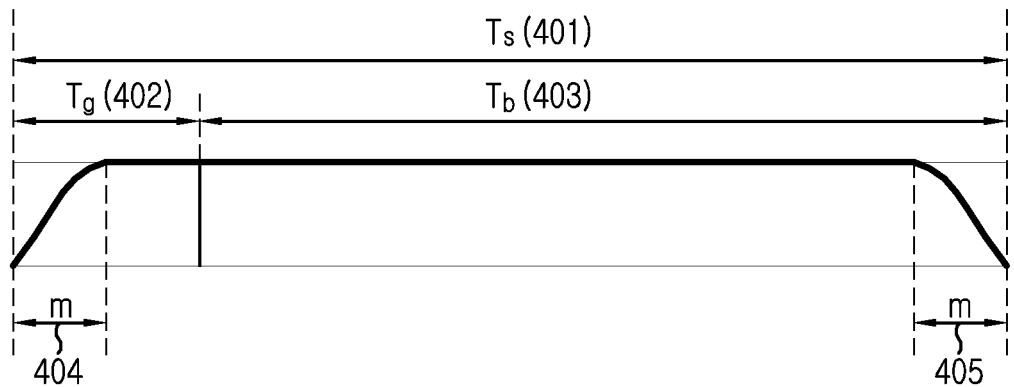
FIG. 4A illustrates a symbol to which a window function is applied according to various embodiments of the present disclosure.

FIG. 4A illustrates a symbol to which a window function is applied according to various embodiments of the present disclosure.

Referring to FIG. 4A, Ts denotes a symbol duration 401 and indicates 1 symbol section, $T_g$ denotes a guard interval, and $T_b$ denotes an available symbol section 403. A single symbol is formed of a guard interval $T_g$ and an available symbol section $T_b$. In the case of the guard interval $T_g$, the back part of the available symbol section $T_b$ is copied and is inserted as a CP. The length of the back part corresponds to the guard interval $T_g$, which may be zero-padding processed.

According to various embodiments of the present disclosure, with respect to a signal having 1 symbol duration Ts, a section 404 (e.g., a front part of a symbol) from the beginning of the symbol duration Ts to a leading window size m is multiplied by Equation (6) or Equation (7), a section 405 (e.g., a end part of a symbol) from a point after the leading window size m to Ns-m is multiplied by 1, and a section from a point after Ns-m to the end of the symbol is multiplied by Equation (6) or Equation (7). Accordingly, 1 symbol section windowing is executed. Since the section from the point after the leading window size m to Ns-m is multiplied by 1, the signal is identical to an original signal, and the section of the leading window size m and the section of an ending window size m may distort the original signal through windowing. Ns denotes the number of time samples with respect to a symbol duration Ts.

Figure 4B:
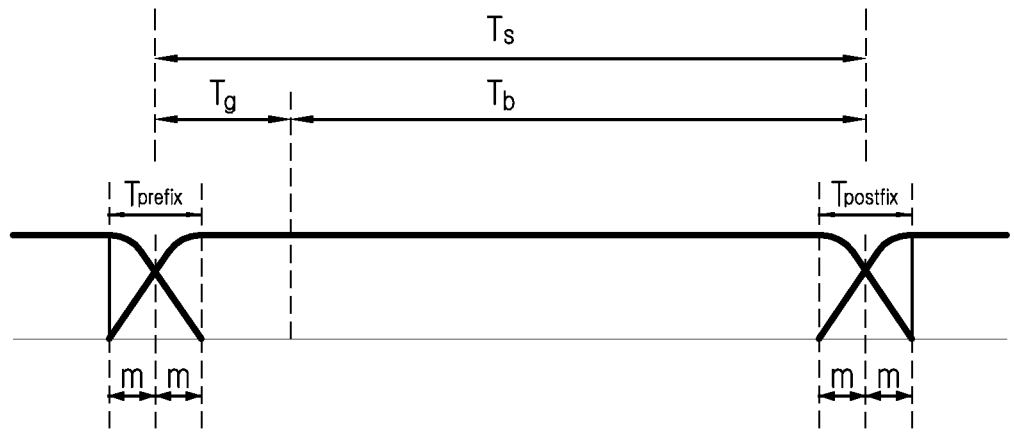
FIG. 4B illustrates an example of a partial overlap of two symbols to which a window function is applied, according to various embodiments of the present disclosure.

FIG. 4B illustrates an example of a partial overlap of two symbols to which a window function is applied, according to various embodiments of the present disclosure.

Referring to FIG. 4B, $T_s$ denotes a symbol duration and indicates 1 symbol section, $T_g$ denotes a guard interval, and $T_b$ denotes an available symbol section. A 3-symbol section windowing scheme overlaps a signal of a previous symbol and a prefix part ($T_{prefix}$) of a current symbol, and overlaps a signal of a subsequent symbol and a postfix part ($T_{postfix}$) of the current symbol.

Among various windows, a Hann window (also known as a Hanning window) is defined as shown in Equation (3), as follows:

$$w_0(n) = \frac{1}{2}\left(1 + \cos\left(\frac{2\pi n}{N-1}\right)\right), 0 \le n \le N-1 \quad (3)$$

A Hanning window generally refers to a window in which zeros at the first and last samples in Hann window are excluded. Therefore a Hanning window is actually the same as a Hann window except for sample length 2. Similarly, a Triangular window excludes the first and last samples in a Bartlett window.

The Hann window function corresponds to a predetermined case of a generalized Hamming window, defined in Equation (4) as follows:

$$w_{gh}(n) = \left(a + b \cdot \cos\left(\frac{2\pi n}{N-1}\right)\right), 0 \le n \le N-1 \quad (4)$$

A raised cosine window may be defined as shown in Equation (5), provided below. When a transition section and the Hann window function are compared, it is determined that they are an identical window function, considering a constant factor, since a and b are identical (when a sign is disregarded).

$$H(f) = \begin{cases} T, & |f| \le \frac{1-\beta}{2T} \\ \frac{T}{2}\left[1 + \cos\left(\frac{\pi T}{\beta}\left[|f| - \frac{1-\beta}{2T}\right]\right)\right], & \frac{1-\beta}{2T} < |f| < \frac{1+\beta}{2T} \\ 0, & \text{otherwize} \end{cases} \quad (5)$$

In Equation (5), $0 \le \beta \le 1$.

Figure 5:
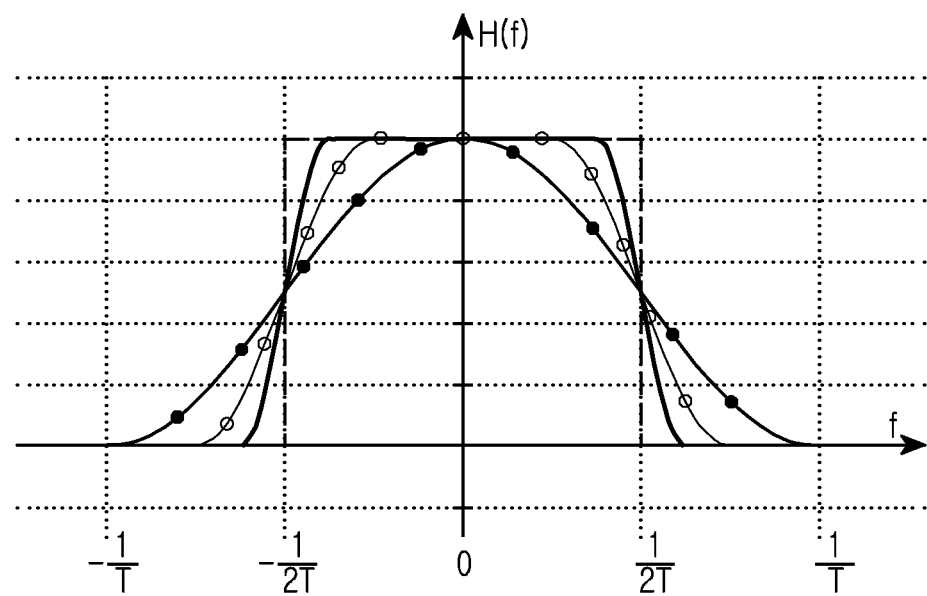
FIG. 5 illustrates characteristics of a raised cosine window associated with a change of a roll-off factor according to various embodiments of the present disclosure.

FIG. 5 illustrates characteristics of a raised cosine window function H(f) associated with a change of a roll-off factor ($\beta$) according to various embodiments of the present disclosure.

Referring to FIG. 5, $\beta$ in Equation (5) denotes a roll-off factor which indicates a ratio of a window length to the entire symbol length.

Figure 6:
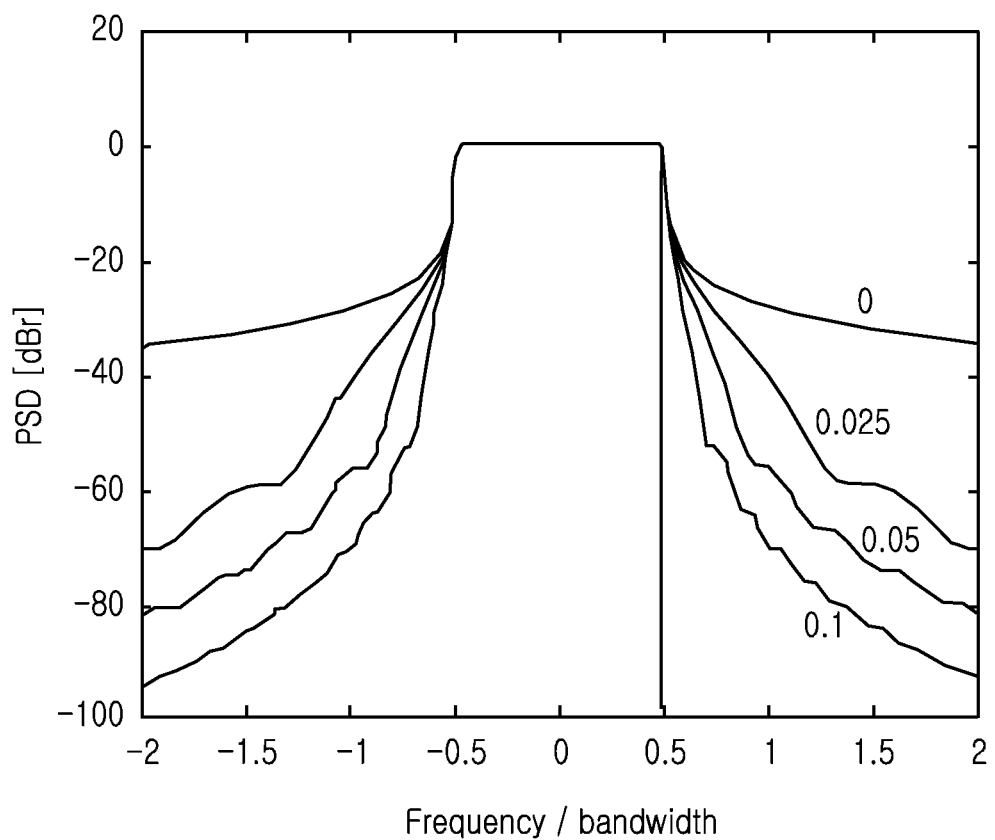
FIG. 6 illustrates a change of a spectrum based on a roll-off factor of a raised cosine window according to various embodiments of the present disclosure.

FIG. 6 illustrates a change of a spectrum based on a change of a window length, i.e. a change of a roll-off factor ($\beta$ in FIG. 5) in a 64 subcarriers OFDM/SC_FDMA system to which the raised cosine window function is applied, according to various embodiments of the present disclosure.

Various types of window functions have been discussed, such as Hanning (Hann, raised cosine), Hamming, Triangular (Bartlett), Rectangular (flat-top), Parzen, Welch, Blackman, Nuttall, Gaussian, Tukey, Slepian, and Kaiser. Of these, Hanning (Hann, raised cosine), Triangular (Bartlett), and Rectangular window functions satisfy the Nyquist criterion. Therefore, when windows overlap each other during use of a window function that does not satisfy the Nyquist criterion, corresponding power may increase or decrease, which would be detrimental to spectrum control.

Disclosed in the present disclosure is a SPAW that controls a spectrum. The SPAW may be defined as shown in Equation 6 provided below, which is a linear combination of the Hanning window function and Triangular window function that satisfy the Nyquist criterion.

$$w_{proposed} = \frac{n}{L_{length}+1} + \alpha \cdot \left\{ \frac{1}{2}\left(1+\cos\left(\frac{2\pi n}{L_{length}+1}\right)\right) - \frac{n}{L_{length}+1} \right\} \quad n = 1, 2, 3, \ldots, L_{length} \tag{6}$$

Equation (6) may be expressed as shown in Equation (7), as follows:

$$w_{proposed} = \frac{n}{L_{length}+1}(1-\alpha) + \left(\frac{1}{2}\left(1+\cos\left(\frac{2\pi n}{L_{length}+1}\right)\right)\right) \cdot \alpha, \quad n = 1, 2, 3, \ldots, L_{length} \tag{7}$$

In Equation (7), $L_{length}$ denotes an ascending or descending window length. Equation (6) or Equation (7) may be derived from a linear combination of the Hanning window and the Triangular window that satisfy the Nyquist criterion.

The first term in Equation (6) corresponds to the Triangular window part $$\left( w_{Triangular}(n) = \frac{n}{L_{length}+1} \right)$$

and the second term corresponds to a difference between the Hanning window $$w_{Hanning}(n) = \frac{1}{2}\left(1+\cos\left(\frac{2\pi n}{L_{length}+1}\right)\right)$$

and the Triangular window.

A windowing coefficient disclosed in Equation (6) or Equation (7) may vary based on $\alpha$. When $\alpha$ is 0, $\alpha$ is identical to the Triangular window, and when $\alpha$ is 1, $\alpha$ is identical to the Hanning window coefficient.

Figure 7:
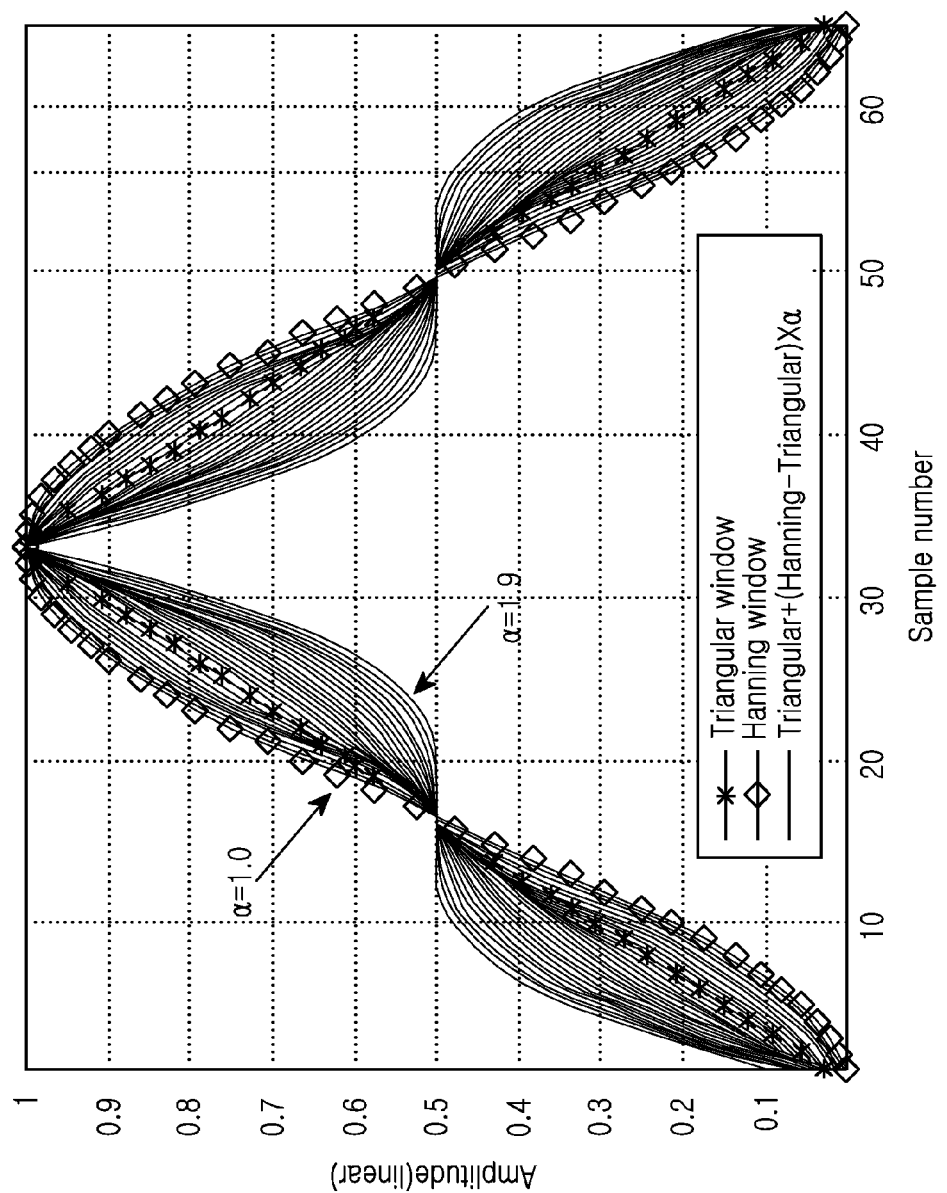
FIG. 7 illustrates a windowing form based on α in a Side-lobe Position Adjustable Window (SPAW) according to various embodiments of the present disclosure.

FIG. 7 illustrates window coefficient values when $\alpha$ is changed by 0.1 in a range of $-1.9 \leq \alpha \leq 1.0$ in Equation (6) or Equation (7), as an example. The Triangular window and the Hanning window basically satisfy the Nyquist criterion, even though $\alpha$ is changed. That is, in FIG. 7 an amplitude value is 0.5 at a $16^{th}$ sample in the x-axis, and the graph is completely symmetrical based on the point in which the amplitude value is 0.5. In addition, although a value that is greater than 0 and less than 1 is generally applied as $\alpha$, the present disclosure is not limited to this value, and may include a negative value and a value greater than 1.

Figure 8:
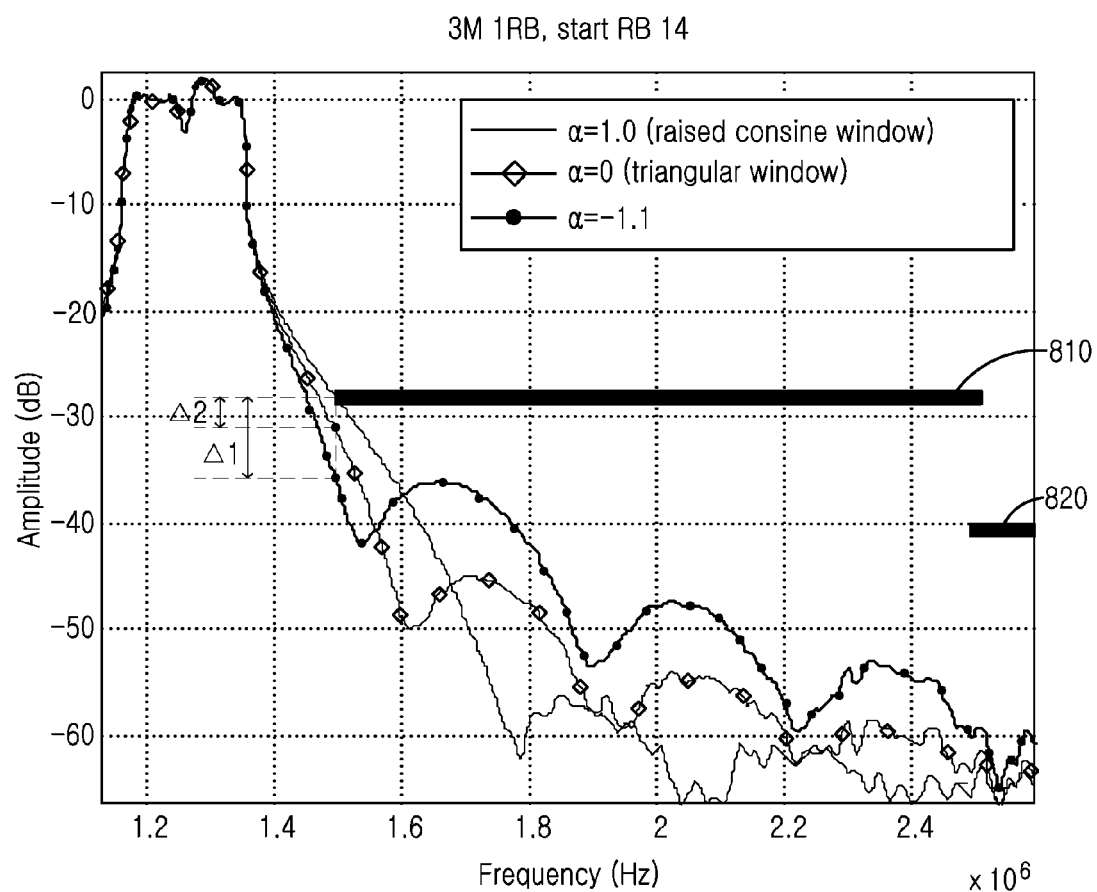
FIG. 8 illustrates a change of a spectrum based on α in a SPAW according to various embodiments of the present disclosure.

FIG. 8 illustrates a change of a spectrum based on $\alpha$ in a SPAW according to various embodiments of the present disclosure.

Referring to FIG. 8, for example, at the beginning of a spectrum emission mask, SPAW ($\alpha=-1.1$) has the largest margin ($\Delta_1$) for the spectrum emission mask, the Triangular window function ($\alpha=0$) has the second largest margin ($\Delta_2$) for the spectrum emission mask, and the raised cosine window function ($\alpha=1$) has the smallest margin for the spectrum emission mask. For example, the raised cosine window function has almost no margin for the spectrum emission mask.

FIG. 8 illustrates a result of a spectrum based on a change of $\alpha$, when a PUSCH signal having an RB size=1RB and an RB offset=14 is transmitted at a maximum power of 23 dB in a bandwidth of LTE 3 MHz. Lines 810 and 820 of FIG. 8 illustrate General Evolved Universal Terrestrial Radio Access (E-UTRA) spectrum emission masks specified in 3GPP TS36.101, which are listed below in Table 2. In addition, Table 3 below lists a result of measuring a margin value for a spectrum emission mask based on various $\alpha$ values, with respect to several sections. A result based on the raised cosine windowing, which is the conventional method, shows a margin of approximately 1 dB, but when $\alpha$ is $-1.5$, the margin increases up to 8.6 dB. In this instance, however, the margin decreases in another section of the spectrum. Accordingly, $\alpha$ is generally set to $-1.1$.

The margins may be changed by an analog baseband LPF in a RFIC. A part (Frequency region) where analog filtering is sufficiently applicable may be complemented through analog filtering although a margin from digital domain is low, thereby yielding minimal effect. However, analog filtering may be difficult for a part where measurement of a spectrum emission mask begins. For this spectrum beginning part, a signal needs to be output to a DAC when a sufficient margin is secured in a digital processing, rendering the disclosed windowing scheme very useful.

TABLE 2

| Spectrum emission limit (dBm)/Channel bandwidth | | | | | | | |
|---|---|---|---|---|---|---|---|
| $\Delta f_{OOB}$ (MHz) | 1.4 MHz | 3.0 MHz | 5 MHz | 10 MHz | 15 MHz | 20 MHz | Measurement bandwidth |
| ±0-1 | −10 | −13 | −15 | −18 | −20 | −21 | 30 kHz |
| ±1-2.5 | −10 | −10 | −10 | −10 | −10 | −10 | 1 MHz |
| ±2.5-2.8 | −25 | −10 | −10 | −10 | −10 | −10 | 1 MHz |
| ±2.8-5 | | −10 | −10 | −10 | −10 | −10 | 1 MHz |
| ±5-6 | | −25 | −13 | −13 | −13 | −13 | 1 MHz |
| ±6-10 | | | −25 | −13 | −13 | −13 | 1 MHz |
| ±10-15 | | | | −25 | −13 | −13 | 1 MHz |
| ±15-20 | | | | | −25 | −13 | 1 MHz |
| ±20-25 | | | | | | −25 | 1 MHz |

TABLE 3 spectrum emission mask margin (dB) in various sections

| Window size 24 α value | Margin measured at a 30 kHz BW centered at 1.5 MHz (1.5 MHz means the point apart from SEM beginning point) | Margin measured at a 30 kHz BW centered at 1.65 MHz | Margin measured at a 30 kHz BW centered at 2.5 MHz | EVM (dB) |
|---|---|---|---|---|
| −1.9 | 8.3064 | 5.4995 | 30.4888 | −35.08 |
| −1.5 | 8.6324 | 7.1813 | 31.2689 | −35.34 |
| −1.4 | 8.5631 | 7.6711 | 31.5599 | −36.11 |
| −1.3 | 8.4581 | 8.1719 | 31.8749 | −36.38 |
| −1.2 | 8.2845 | 8.7021 | 32.0838 | −36.67 |
| −1.1 | 8.0805 | 9.267 | 32.2395 | −37.27 |
| −1 | 7.8304 | 9.853 | 32.4459 | −37.58 |
| −0.9 | 7.8304 | 10.5083 | 32.6038 | −37.9 |
| −0.8 | 7.2398 | 11.2034 | 32.9725 | −38.25 |
| −0.7 | 6.9304 | 11.9485 | 33.1399 | −38.59 |
| −0.6 | 6.5911 | 12.7685 | 33.3046 | −38.97 |
| −0.5 | 6.2409 | 13.6326 | 33.637 | −39.35 |
| 0 | 4.4999 | 19.498 | 34.5859 | −41.51 |
| 0.5 | 2.8666 | 21.5285 | 35.0452 | −44.29 |
| 1 | 1.4091 | 15.1636 | 35.4043 | −47.96 |

Figure 9:
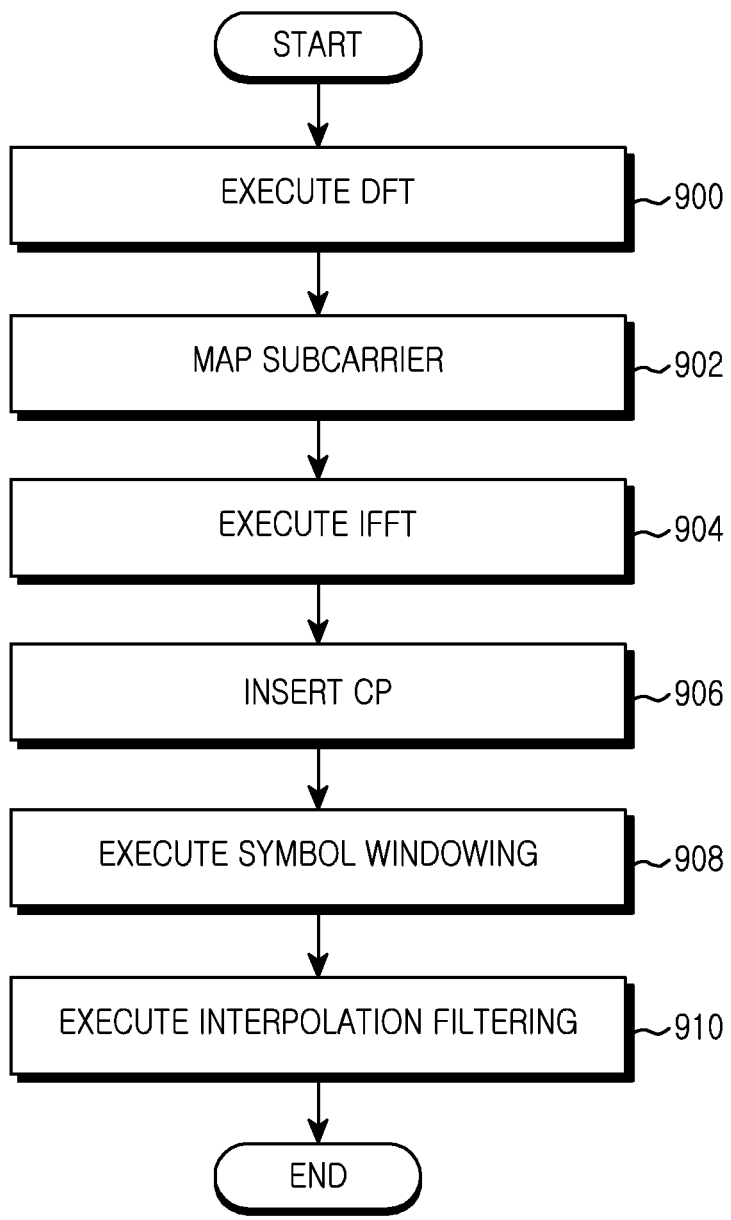
FIG. 9 is a flowchart of a transmitter based on SC-FDMA according to various embodiments of the present disclosure.

FIG. 9 is a flowchart of a transmitter based on SC-FDMA according to various embodiments of the present disclosure.

Referring to FIG. 9, an SC-FDMA transmitter executes DFT on a data symbol in step 900, allocates the data symbol to a desired location in the frequency domain in step 902, executes IFFT in step 904, attaches a CP to the front part of the symbol in step 906, executes windowing using a SPAW function in step 908, and executes interpolation in step 910.

For example, in the windowing operation, the end part of the data required for executing SPAW on a subsequent symbol may be stored in a buffer. Therefore, the SPAW scheme may be simultaneously applied with respect to the stored end part of the previous symbol and a CP of the front part of a current symbol. An ascending SPAW for the CP of the current symbol and a descending SPAW for the previous symbol data are simultaneously processed, and the two signals are output in a manner overlapping one another. The descending SPAW and the ascending SPAW have a symmetric structure based on a center point.

Figure 10:
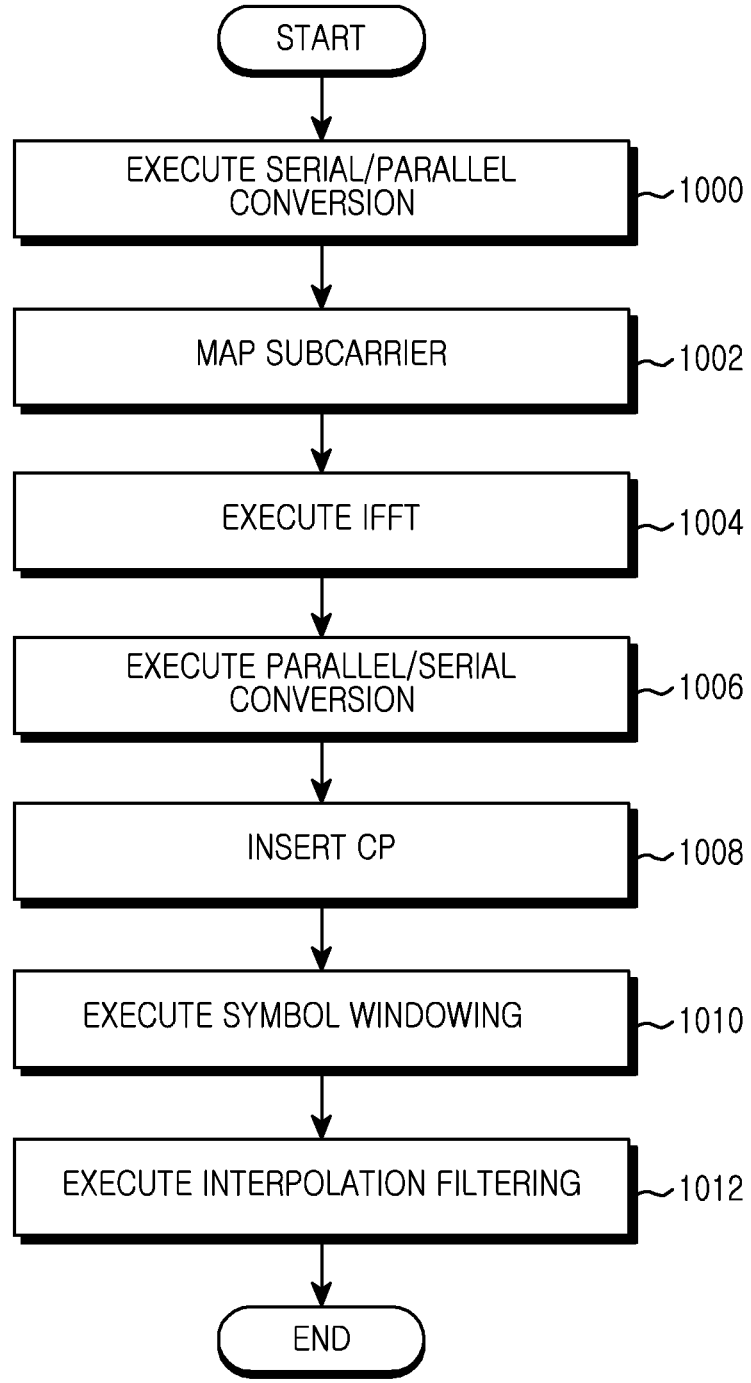
FIG. 10 is a flowchart of a transmitter based on OFDM according to various embodiments of the present disclosure.

FIG. 10 is a flowchart of a transmitter based on OFDM according to various embodiments of the present disclosure.

Referring to FIG. 10, an OFDM transmitter converts a serial data symbol into a parallel data symbol in step 1000, allocates the data symbol to a desired location in the frequency domain in step 1002, executes IFFT in step 1004, converts the IFFT-processed parallel signal in the time domain into a serial signal in step 1006, attaches a CP to a front part of the symbol in step 1008, executes windowing using a SPAW function in step 1010, and executes interpolation in step 1012.

For example, although the OFDM transmitter configures an identical transmission path to an SC-FDMA transmitter, the OFDM transmitter omits DFT processing. In addition, when the conventional raised cosine window scheme is used, an additional margin of a spectrum emission mask may be obtained by using a high-order LPF after windowing processing. When a main-lobe and a side-lobe are extremely close to each other in a spectrum (for example, LTE uplink 1.4 Mbps and 3M bps), the high-order LPF must be used to obtain a higher attenuation of the side-lobe. However, a sufficient margin of a spectrum emission mask may be obtained by changing a value of parameter a of the SPAW function disclosed in the present disclosure. Accordingly, the high-order LPF is not needed.

Figure 11:
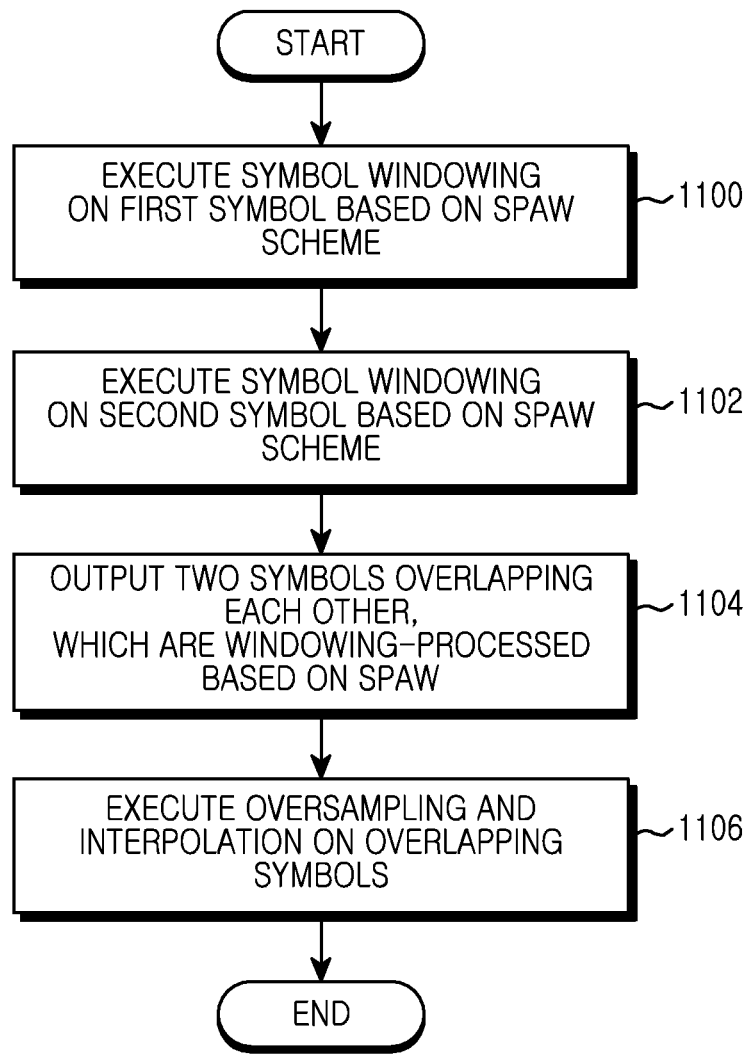
FIG. 11 illustrates a symbol processing method using a SPAW according to various embodiments of the present disclosure.

FIG. 11 illustrates a symbol processing method using a SPAW according to various embodiments of the present disclosure.

Referring to FIG. 11, the symbol windowing processors 309 and 310 execute windowing with respect to an end part of a first symbol using a SPAW function in step 1100 (see FIG. 4A), execute windowing with respect to the front part of a second symbol (for example, a CP) using the SPAW function in step 1102 (see FIG. 4A), and output the two symbols overlapping each other, wherein the two symbols are windowing-processed based on the SPAW scheme (see FIG. 4B) in step 1104. In step 1106, oversampling and interpolation may be executed with respect to overlapping symbols.

A method of executing operations by a chip set includes generating a plurality of consecutive symbols, changing a spectrum characteristic of each of the plurality of consecutive symbols by applying a first window function and a third window function, that uses a difference between the first window function and a second window function and processing neighboring symbols from among the plurality of consecutive symbols of which spectrum characteristics are changed, such that the neighboring symbols partially overlap one another.

The first window function is a triangular window function and the second window function is a Hanning window function, or the first window function is the Hanning window function and the second window function is the triangular window function.

The third window function is defined by the following:

$$w_{proposed} = \frac{n}{L_{length}+1} + \alpha \cdot \left\{ \frac{1}{2}\left(1 + \cos\left(\frac{2\pi n}{L_{length}+1}\right)\right) - \frac{n}{L_{length}+1} \right\},$$

wherein n=1, 2, 3, . . . , $L_{length}$, and α is a parameter for determining a side-lobe spectrum attenuation level of an output signal.

The spectrum characteristic of the symbol is a spectrum emission mask or an Adjacent Channel leakage Ratio (ACLR).

When the symbol is a Single Carrier Frequency Division Multiple Access (SC-FDMA) symbol, the chip set further executes operations with respect to a group of N modulated data symbols, the operations further includes executing N-point Discrete Fourier Transform (DFT) with respect to the N modulated data symbols, and generating a set of N frequency domain components of the N modulated data symbols, mapping N frequency domain components of the N modulated data symbols to N sub-carriers corresponding to a subband width of M sub-carriers (M>N), generating a complex time domain signal by executing M-point IFFT with respect to the set of M complex sub-carrier amplitudes and generating a reference sequence of M discrete time domain values and adding a Cyclic Prefix (CP) to the complex time domain signal.

When the symbol is an Orthogonal Frequency Division Multiplexing (OFDM) symbol, the chip set further executes operations further includes converting serial bit data into parallel bit data, mapping a bit data packet from a serial/parallel converter into a predetermined symbol packet based on a data size of a predetermined unit bit, executing Inverse Fast Fourier Transform (IFFT) on a symbol packet from a symbol mapper, and transforming the symbol packet in the frequency domain into a symbol packet in the time domain, converting a parallel symbol packet from an IFFT unit into a serial symbol packet and adding a Cyclic Prefix (CP) to a symbol packet from the parallel/serial converter, and forming a symbol transmission packet.

As described above, a margin of a spectrum emission mask may be secured by changing a side-lobe attenuation level of a spectrum of a signal, using a SPAW, without using an additional LPF, and the margin is larger than a margin obtained using the raised cosine window.

The methods described above with reference to FIGS. 9-11 can be further implemented in a device (e.g., a chip set).

While the present disclosure has been shown and described with reference to certain embodiments thereof, it will be understood by those skilled in the art that various changes in form and details may be made therein without departing from the scope of the present disclosure. Therefore, the scope of the present disclosure should not be defined as being limited to the embodiments, but should be defined by the appended claims and equivalents thereof.

What is claimed is:

1. A transmission apparatus, comprising:
a symbol generator configured to generate a first signal comprising a main-lobe and a side-lobe; and
a symbol windowing processor operatively coupled with the symbol generator,
wherein the symbol windowing processor is configured to:
generate a second signal to attenuate the side-lobe by applying a window function to the first signal,
wherein the window function is determined based on a parameter,
wherein the parameter is adaptively determined according to a size of the side-lobe, and is determined based on a difference between the main-lobe and the side-lobe,
wherein the window function is further determined by adding a first window function and a first function,
wherein the first function is determined by multiplying the parameter and a difference between the first window function and a second window function,
wherein the first window function is a triangular window function, and
wherein the second window function is a hanning window function.

2. The apparatus of claim 1, wherein the window function is determined by the following:

$$w_{proposed} = \frac{n}{L_{length} + 1} + \alpha \cdot \left\{ \frac{1}{2}\left(1 + \cos\left(\frac{2\pi n}{L_{length} + 1}\right)\right) - \frac{n}{L_{length} + 1} \right\},$$

wherein $w_{proposed}$ indicates the window function,
wherein $L_{length}$ indicates a length of a window of the window function,
wherein n indicates a natural number from 1 to $L_{length}$,
wherein $\alpha$ indicates the parameter,
wherein $$\frac{n}{L_{length} + 1}$$

is the first window function, and
wherein $$\frac{1}{2}\left(1 + \cos\left(\frac{2\pi n}{L_{length} + 1}\right)\right)$$

is the second window function.

3. The apparatus of claim 1, wherein the window function is applied to a cyclic prefix (CP) included in the first signal.

4. The apparatus of claim 3, the side-lobe is located in the CP.

5. The apparatus of claim 1, wherein the first signal is generated by inserting a cyclic prefix (CP) to a symbol sequence on a time domain.

6. The apparatus of claim 1, wherein a characteristic of the first signal is a spectrum emission mask or an adjacent channel leakage ratio (ACLR).

7. The apparatus of claim 1, further comprising:
an interpolation filter configured to generate an output signal by filtering the second signal.

8. A method for operating a transmission apparatus, the method comprising:
generating, by a symbol generator a first signal comprising a main-lobe and a side-lobe; and
generating, by a symbol windowing processor, a second signal to attenuate the side-lobe by applying a window function to the first signal,
wherein the window function is determined based on a parameter, and
wherein the parameter is adaptively determined according to a size of the side-lobe, and is determined based on a difference between the main-lobe and the side-lobe,
wherein the window function is further determined by adding a first window function and a first function,
wherein the first function is determined by multiplying the parameter and a difference between the first window function and a second window function,
wherein the first window function is a triangular window function, and
wherein the second window function is a hanning window function.

9. The method of claim 8, wherein the window function is determined by the following:

$$w_{proposed} = \frac{n}{L_{length} + 1} + \alpha \cdot \left\{ \frac{1}{2}\left(1 + \cos\left(\frac{2\pi n}{L_{length} + 1}\right)\right) - \frac{n}{L_{length} + 1} \right\},$$

wherein $w_{proposed}$ indicates the window function,
wherein $L_{length}$ indicates a length of a window of the window function,
wherein n indicates a natural number from 1 to $L_{length}$,
wherein $\alpha$ indicates the parameter,
wherein $$\frac{n}{L_{length} + 1}$$

is the first window function, and
wherein $$\frac{1}{2}\left(1 + \cos\left(\frac{2\pi n}{L_{length} + 1}\right)\right)$$

is the second window function.

10. The method of claim 8, wherein the window function is applied to a cyclic prefix (CP) included in the first signal.

11. The method of claim 10, the side-lobe is located in the CP.

12. The method of claim 8, wherein the first signal is generated by inserting a cyclic prefix (CP) to a symbol sequence on a time domain.

13. The method of claim 8, wherein a characteristic of the first signal is a spectrum emission mask or an adjacent channel leakage ratio (ACLR).

14. The method of claim 8, further comprising:
generating an output signal by filtering the second signal.

* * * * *